United States Patent [19]
Hshieh et al.

[11] Patent Number: 5,558,313
[45] Date of Patent: Sep. 24, 1996

[54] TRENCH FIELD EFFECT TRANSISTOR WITH REDUCED PUNCH-THROUGH SUSCEPTIBILITY AND LOW $R_{DSON}$

[75] Inventors: Fwu-Iuan Hshieh, Saratoga; Mike F. Chang, Cupertino, both of Calif.

[73] Assignee: Siliconix inorporated, Santa Clara, Calif.

[21] Appl. No.: 386,895

[22] Filed: Feb. 10, 1995

Related U.S. Application Data

[63] Continuation-in-part of Ser. No. 918,954, Jul. 24, 1992, and Ser. No. 131,114, Oct. 1, 1993, which is a continuation of Ser. No. 925,336, Aug. 4, 1992, abandoned.

[51] Int. Cl.⁶ .............................. H01L 29/76; H01L 29/94
[52] U.S. Cl. ................ 257/342; 257/328; 257/331; 257/335; 257/339; 257/341
[58] Field of Search ................... 257/328, 331, 257/335, 339, 341, 342, 23

[56] References Cited

U.S. PATENT DOCUMENTS

| | | | |
|---|---|---|---|
| 4,078,947 | 3/1978 | Johnson et al. | 148/1.5 |
| 4,376,286 | 3/1983 | Lidow et al. | 357/23 |
| 4,593,302 | 6/1986 | Lidow et al. | 357/23.4 |
| 4,642,666 | 2/1987 | Lidow et al. | 357/23.4 |
| 4,680,853 | 7/1987 | Lidow et al. | 29/571 |
| 4,705,759 | 11/1987 | Lidow et al. | 437/29 |
| 4,803,532 | 2/1989 | Mihara | 357/234 |
| 4,941,026 | 7/1990 | Temple | 357/23.4 |
| 4,959,699 | 9/1990 | Lidow et al. | 357/23.7 |
| 5,008,725 | 4/1991 | Lidow et al. | 357/23.4 |
| 5,016,066 | 5/1991 | Takahashi | 357/23.4 |
| 5,072,266 | 12/1991 | Bulucea et al. | 357/23.4 |
| 5,138,422 | 8/1992 | Fujii et al. | 357/49 |
| 5,168,331 | 12/1992 | Yilmaz | 257/331 |

FOREIGN PATENT DOCUMENTS

| | | | |
|---|---|---|---|
| 0335750 | 10/1989 | European Pat. Off. | |
| 0345380 | 12/1989 | European Pat. Off. | 257/330 |
| 55-67161 | 5/1980 | Japan | 257/335 |
| 55-146976 | 11/1980 | Japan | 357/339 |
| 56-58267 | 5/1981 | Japan | 257/330 |
| 57-153469 | 9/1982 | Japan | 257/335 |
| 57-188877 | 11/1982 | Japan | |
| 59-84474 | 5/1984 | Japan | 257/329 |
| 62-176168 | 8/1987 | Japan | 257/342 |
| 1-42177 | 2/1989 | Japan | 257/339 |

OTHER PUBLICATIONS

Stanley Wolf, Ph.D., et al., "Silicon Processing for the VLSI Era—vol. 1: Process Technology", Lattice Press, 1986, pp. 124–160.
Stanley Wolf, Ph.D., "Silicon Processing for the VLSI Era—vol. 2: Process Integration", Lattice Press, 1990, pp. 674–675.
Syau, Tsengyou et al., "Comparison of Ultralow Specific On–Resistance UMOSFET Structures: The Accufet, Extfet, Invfet, and Conventional UMOSFET's," *IEEE Transactions on Electron Devices* 41:800–808 (May 1994).

*Primary Examiner*—Sara W. Crane
*Assistant Examiner*—Valencia Martin Wallace
*Attorney, Agent, or Firm*—Skjerven, Morrill, MacPherson, Franklin & Friel; Norman R. Klivans; T. Lester Wallace

[57] ABSTRACT

To reduce susceptibility to punchthrough, the channel region of the P body region of a trench field effect transistor is formed in a layer of lightly doped epitaxial silicon. As a result, the channel region has less counterdoping from the background epitaxial silicon and has a greater net P type dopant concentration. Due to the higher net dopant concentration of the P body region, the depletion regions on either side of the P body region expand less far inward through the P body region at a given voltage, thereby rendering the transistor less susceptible to source-to-drain punchthrough. To maintain a low $R_{DSon}$, the relatively high conductivity of an accumulation region formed along a sidewall of the trench of the transistor when the transistor is on is used to form a conductive path from the channel region to an underlying relatively highly conductive layer upon which the lightly doped epitaxial layer is formed. This underlying relatively highly conductive layer may, for example, be either substrate or a more highly doped epitaxial silicon layer.

6 Claims, 4 Drawing Sheets

TRENCH FIELD EFFECT TRANSISTOR WITH REDUCED PUNCH-THROUGH SUSCEPTIBILITY AND LOW $R_{DSON}$

CROSS-REFERENCE TO RELATED APPLICATIONS

This application is a continuation-in-part of copending U.S. application Ser. No. 08/131,114 entitled "Low Threshold Voltage Epitaxial DMOS Technology", filed Oct. 1, 1993, which in turn is a continuation of U.S. patent application Ser. No. 07/925,336, filed Aug. 4, 1992, now abandoned, the subject matter of which is incorporated herein by reference. This application is also a continuation-in-part of copending U.S. application Ser. No. 07/918,954 entitled "Field Effect Trench Transistor Having Lightly Doped Epitaxial Region On The Surface Portion Thereof" filed Jul. 24, 1992, the subject matter of which is incorporated herein by reference.

FIELD OF THE INVENTION

This invention relates to trench field effect transistors.

BACKGROUND INFORMATION

FIG. 1 (Prior Art) is a simplified cross-sectional diagram of a conventional planar double diffused field effect transistor. A layer of N type epitaxial silicon 1 is formed on an N+ type substrate 2. A P body region 3A and a P+ body region are formed into the epitaxial layer from upper surface 4, and an N+ type source region 5 is formed into the body regions 3A and 3B from upper surface 4. To turn the transistor on (i.e., make it conductive), a positive potential is placed on gate 6. The positive potential on gate 6 causes what is called a channel region to form in the surface portion of P body region 3A underneath the gate and also causes what is called an accumulation region to form in the surface portion of the N type epitaxial silicon region 1A immediately underneath the gate. Electrons can then flow as generally indicated by the arrow from the N+ type source region 5, through the channel region in P body region 3A, through the accumulation region of N type epitaxial layer 1A, downward through the N type epitaxial region 1A, downward through the N+ type substrate 2, and to a drain electrode 7. If gate 6 does not have a positive potential, then no channel is formed and no electron flow from source to drain takes place. The transistor is therefore turned off (i.e., nonconductive).

FIG. 2 (Prior Art) is a simplified cross-sectional diagram of another type of double diffused field effect transistor, a trench field effect transistor. An N type epitaxial layer 1 is formed on a N+ type substrate 2. Body regions 3A and 3B and N+ type source region 5 are then formed in similar double diffused fashion to the body and source regions in the planar transistor. In the case of the trench transistor, a trench is etched down into epitaxial layer 1 from upper surface 4. A gate oxide layer 8 is then grown in this trench on the side walls and the trench bottom. An amount of polysilicon or other suitable material is then deposited on the gate oxide in the trench to form a gate 9. For additional information on trench field effect transistors, see U.S. Pat. No. 5,072,266 entitled "Trench DMOS Power Transistor With Field-Shaping Body Profile And Three-Dimensional Geometry", the subject matter of which is incorporated herein by reference.

To turn the trench transistor on, a positive potential is placed on gate 9. The positive potential causes a channel region to form in the portion of the P body region 3A which forms part of the sidewall of the trench and causes an accumulation region to form in the portion of the N type epitaxial layer region 1A which forms a part of the sidewall of the trench. Electrons can then flow as indicated by the arrow from the N+ type source region 5, downward through the channel region of P body region 3A, downward through the accumulation region, downward through the remainder of the N type epitaxial region 1A, downward through the N+ type substrate 2, and to a drain electrode 7. If gate 9 does not have a positive potential, then no channel is formed and no electron flow from source to drain takes place. The transistor is therefore turned off.

It is desirable that such transistors have low source-to-drain resistances $R_{DSon}$ when turned on. As depicted pictorially in FIG. 1, the resistance $R_{DSon}$ in the planar structure is made up of the resistance $R_{CH}$ through the channel, the resistance $R_{ACC}$ laterally through the accumulation region, the resistance $R_{JFET}$ vertically through the pinched portion of the N type epitaxial region 1A between the two adjacent P body regions, the resistance $R_{DRIFT}$ vertically through the remainder of the N type epitaxial region 1A to the substrate, and the resistance $R_{SUB}$ vertically through the substrate to the drain electrode. As depicted pictorially in FIG. 2, the resistance $R_{DSon}$ in the trench structure is made up of the resistance $R_{CH}$ vertically through the channel, the resistance $R_{ACC}$ vertically through the accumulation region, the resistance $R_{DRIFT}$ vertically through the remainder of the N type epitaxial region 1A, and the resistance $R_{SUB}$ vertically through the substrate to the drain electrode. Note that $R_{JFET}$ is eliminated in the trench device. Because the conductivity of silicon increases with dopant concentration, epitaxial silicon layer 1 is relatively heavily doped to reduce the $R_{DRIFT}$ and thereby reduce $R_{DSon}$.

It is also desirable that such transistors not suffer what is called "punchthrough". When a high voltage is placed across the transistor from the source to the drain such as when the transistor is off in a high voltage application, a depletion region will form along the N+ type source to P body junction. Similarly, a depletion region will form along the P body to N type epitaxial layer region junction. If the source-to-drain voltage is high enough, the depletion regions will extend so far inward into the P body region 3A that they will meet. This is called punchthrough. As a result, an undesirable conductive path is formed through the P body region 3A when the transistor should be off.

A power field effect transistor is sought which has both low $R_{DSon}$ as well as the ability to withstand high source-to-drain voltages without suffering punchthrough problems.

SUMMARY

To reduce susceptibility to punchthrough, the channel region of the P body region of a trench field effect transistor is formed in a layer of lightly doped epitaxial silicon. As a result, the channel region has less counterdoping from the background N type epitaxial silicon dopants and has a greater net P type dopant concentration. Due to the higher net P type dopant concentration of the P body region, the depletion regions on either side of the P body region expand less far inward through the P body region at a given voltage, thereby rendering the transistor less susceptible to source-to-drain punchthrough.

To maintain a low $R_{DSon}$, the relatively high conductivity of an accumulation region formed along a sidewall of the trench of the transistor when the transistor is on is used to form a conductive path from the channel region to an underlying relatively highly conductive layer upon which the lightly doped epitaxial layer is formed. This underlying relatively highly conductive layer may, for example, be either substrate or a more heavily doped epitaxial silicon layer. Some embodiments have low threshold voltages (such as 0.6 to 1.0 volts) and are usable in low voltage battery applications (2.5 to 3.3 volts). Other details of structures and associated methods are also disclosed.

DETAILED DESCRIPTION OF THE PREFERRED EMBODIMENTS

Figure 3:
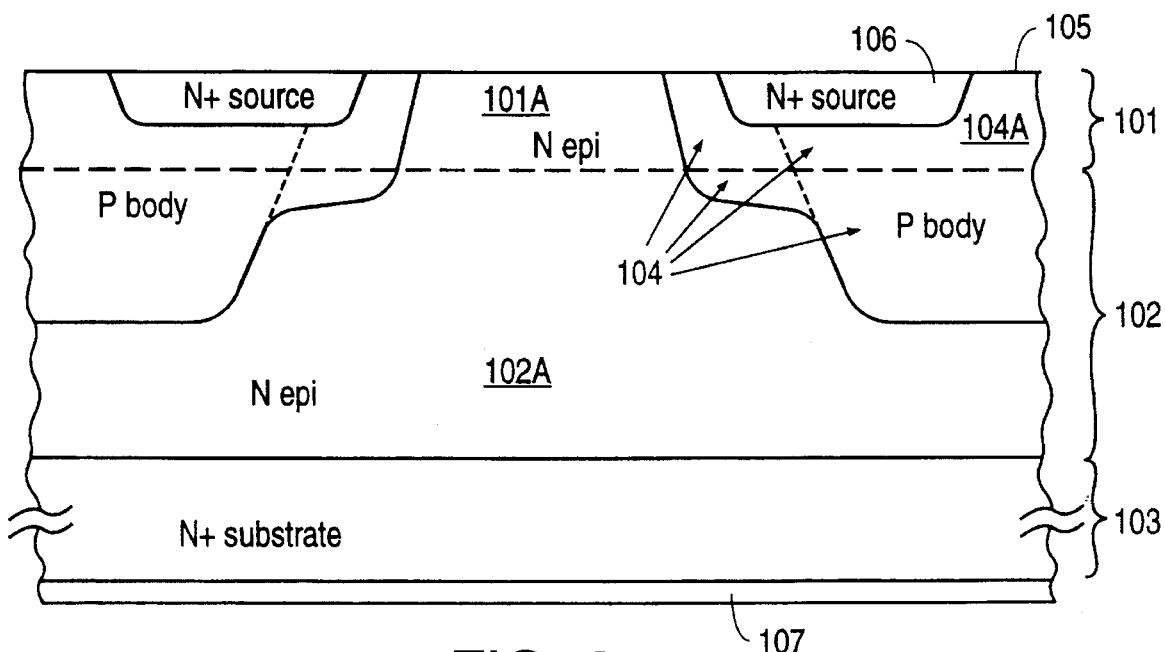
FIG. 3 is a simplified cross-sectional diagram of a planar double diffused field effect transistor.
Figure 2:
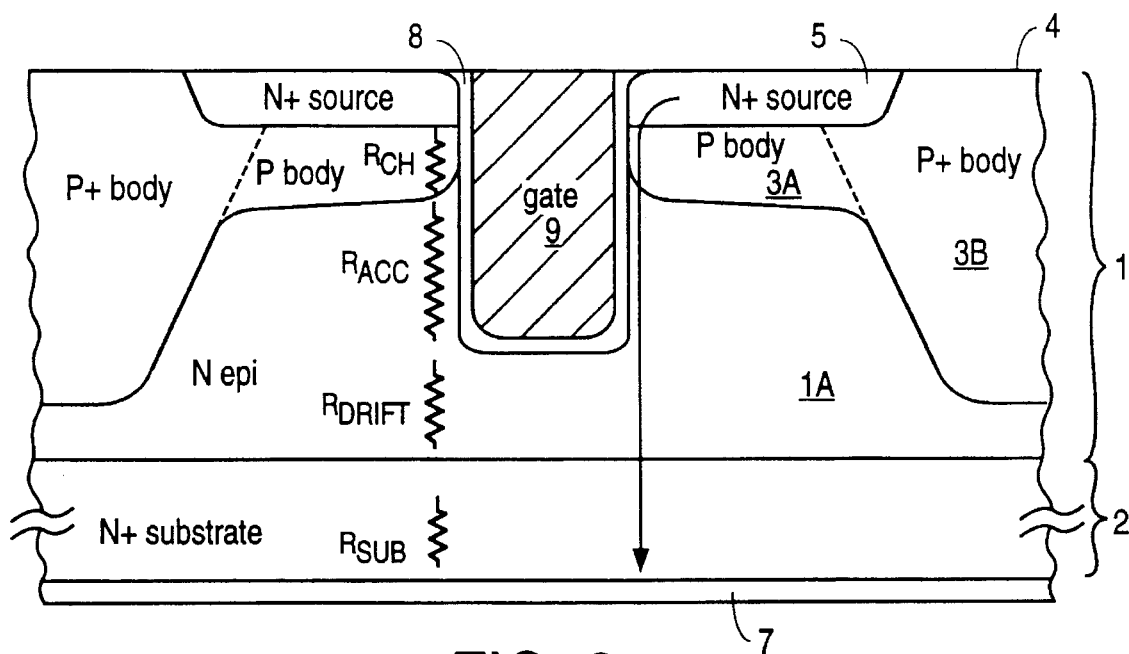
FIG. 2 (Prior Art) is a cross-sectional diagram of a trench double diffused field effect transistor.

FIG. 3 is a simplified cross-sectional diagram of a planar double diffused field effect transistor. A lightly doped N− type epitaxial layer 101 is disposed on a more heavily doped N type epitaxial layer 102 which is in turn disposed on a more heavily doped N+ type substrate layer 103. A P body region 104 is formed into the epitaxial layers 101 and 102 from upper surface 105 to form a relatively heavily doped epitaxial region 102A and a relatively lightly doped epitaxial region 101A. (As indicated by the dashed line, "P body region" 104 is understood to entail a relatively lightly doped doubly diffused portion and a more highly doped body portion which correspond with regions 3A and 3B of FIG. 2, respectively. The dashed lines in FIGS. 4 and 6 similarly indicate that each of those P body regions actually comprises a relatively lightly doped portion and more highly doped portion.)

Figure 1:
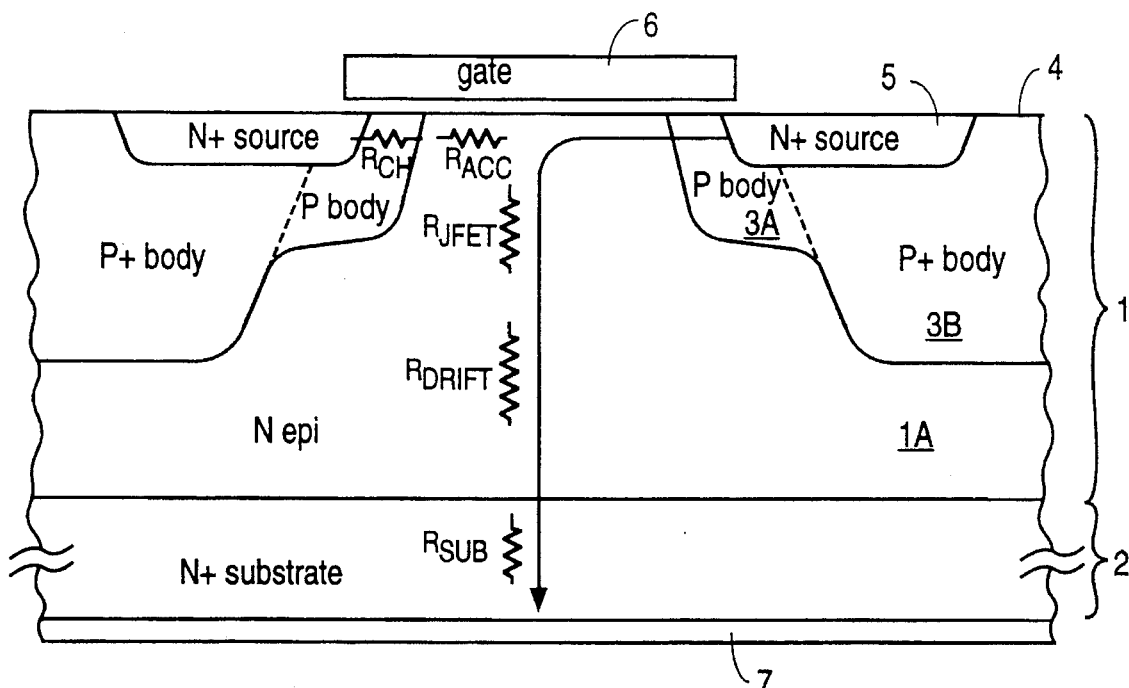
FIG. 1 (Prior Art) is a cross-sectional diagram of a planar double diffused field effect transistor.

N+ type source region 106 is then formed into P body region 104 from upper surface 105. The drain 107 is located on the underside of the substrate 103. The conventional gate (as in FIG. 1) and contacts and other possible layers are not illustrated to improve the clarity of the diagram. Relatively lightly doped N− type epitaxial layer 101 can be either an ion implanted counterdoped portion of layer 102 or it can be grown having its relatively light dopant concentration.

A depletion region expands less far for a given voltage in a relatively heavily doped silicon than it would for that given voltage in a relatively lightly doped silicon. Accordingly, the upper portion 104A (in which the channel region is disposed) has a higher net doping. The relatively lightly doped epitaxial silicon layer 101 is provided so that there will be less background counterdoping of the P body dopants in upper portion 104A. Accordingly, the region 104A of the P body region has a higher net doping concentration and the depletion regions do not punchthrough as easily from source region 106 to region 101A. Furthermore, to maintain a low $R_{DSon}$, the resistance $R_{DRIFT}$ is maintained at a low value due to the use of the relatively heavily doped epitaxial layer 102. Both improved punchthrough resistance as well as low $R_{DSon}$ is therefore achieved. For additional information pertaining to such a structure, see U.S. Pat. No. 5,479,037 entitled "Low Threshold Voltage Epitaxial DMOS Technology", the subject matter of which is incorporated herein by reference.

The structure of FIG. 3, however, involves the higher resistances through the relatively lightly doped N− epitaxial layer region 101A. The structure of FIG. 3 is disclosed in U.S. Pat. No. 5,479,037, the subject matter of which is incorporated herein by reference. To eliminate these high resistances of region 101A in the path the drain-to-source current, the structure of FIG. 4 is provided.

Figure 4:
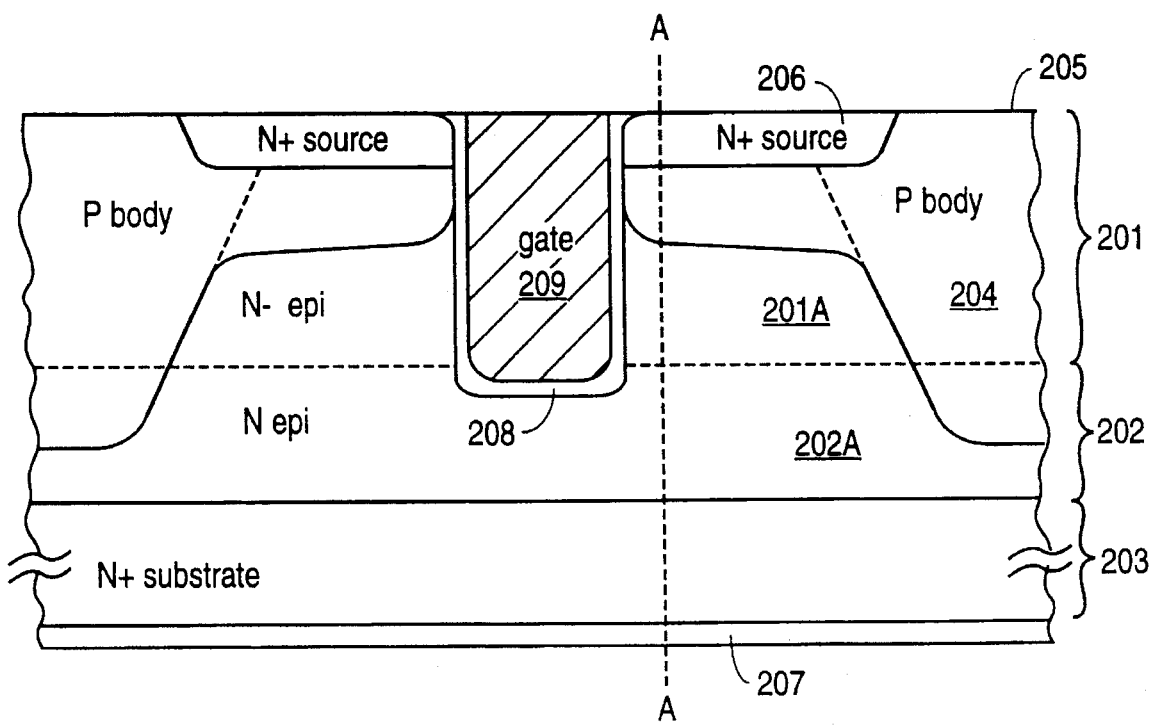
FIG. 4 is a simplified cross-sectional diagram of a trench double diffused field effect transistor formed in a double epitaxial layer structure in accordance with another embodiment of the present invention.

FIG. 4 is a simplified cross-sectional diagram of a trench double diffused field effect transistor which does not incur the resistance penalty that the transistor of FIG. 3 does. A lightly doped N− type epitaxial layer 201 is disposed on a more heavily doped N type epitaxial layer 202 which is in turn disposed on a more heavily doped N+ type substrate layer 203. A P body region 204 is formed into the epitaxial layers 201 and 202 from upper surface 205 to form a relatively heavily doped epitaxial region 202A and a relatively light doped epitaxial region 201A. N+ type source region 206 is formed into P body region 204 from upper surface 205. The drain 207 is located on the underside of the substrate 203. Relatively lightly doped N− type epitaxial layer 201 can be either an ion implanted counterdoped portion of epitaxial layer 202 or it can be grown having its final relatively light dopant concentration. A trench is etched into surface 205 and a gate oxide 208 and gate 209 are formed as in the trench transistor structure of FIG. 2. See U.S. Pat. No. 5,072,266, the contents of which are incorporated herein by reference, for details on fabricating a trench field effect transistor.

The structure of FIG. 4 does not incur the resistance penalty associated with the planar structure of FIG. 3 because electron flow proceeds through the N− type epitaxial region 201A in an accumulation region along the sidewall of the trench. The resistance in an accumulation region is substantially independent of dopant concentration. The gate/trench structure therefore forms a means for controllably forming the accumulation region. After the electrons have passed through the N− type epitaxial region 201A, the electrons pass through the relatively heavily doped N type epitaxial region 202A where the resistance is also low.

Figure 5:
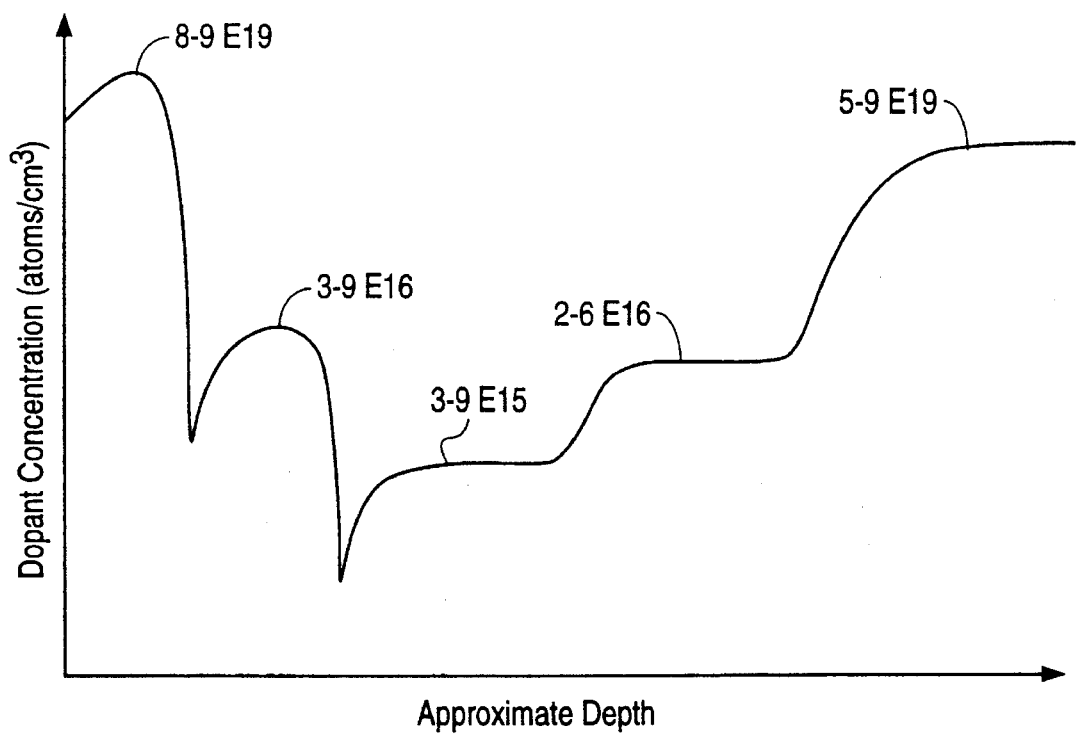
FIG. 5 is an approximate dopant profile taken along line A—A of FIG. 4.

FIG. 5 is a diagram showing an approximate dopant profile along the line labeled A—A in FIG. 4. The 3-9E15 dopant concentration is the approximate dopant concentration of the relatively lightly doped N− type epitaxial region 201A of FIG. 4. The net peak doping concentration in the channel region of P body region 204 is 3-9E16. Dopant concentrations are in atoms/cm$^3$.

Figure 6:
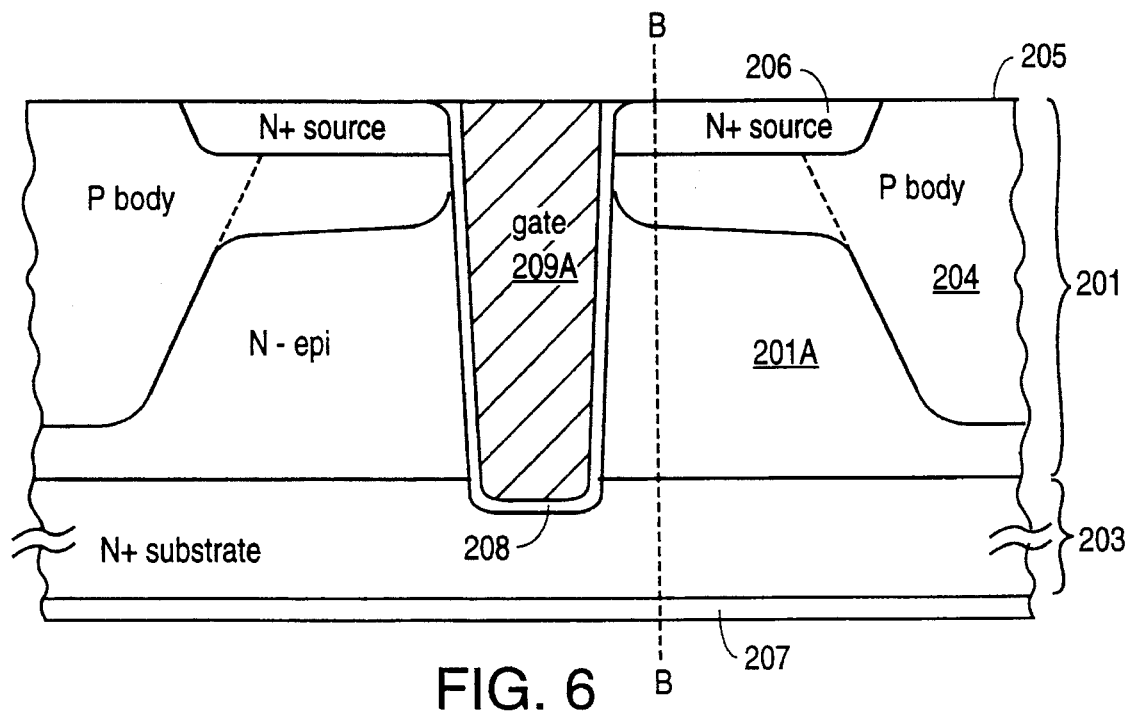
FIG. 6 is a simplified cross-sectional diagram of a trench double diffused field effect transistor formed in a single epitaxial layer structure in accordance with yet another embodiment of the present invention.

FIG. 6 is a simplified cross-sectional diagram of a trench double diffused field effect transistor in accordance with another embodiment of the present invention. The gate region 209A extends into the N+ type substrate 203. Only one epitaxial layer, a relatively lightly doped N− type epitaxial layer 201, is used. Electrons flow vertically in the low resistance accumulation region at the sidewall of the trench from the low resistance channel region in P body region 204 downward to the N+ substrate 203. A specific $R_{DSon}$ in the range of 0.1 to 0.5 ohms-cm$^2$ is achievable in a device having a breakdown voltage in the range of 15 to 30 volts and a threshold voltage in the range of 0.6 to 1.0 volts.

Figure 7:
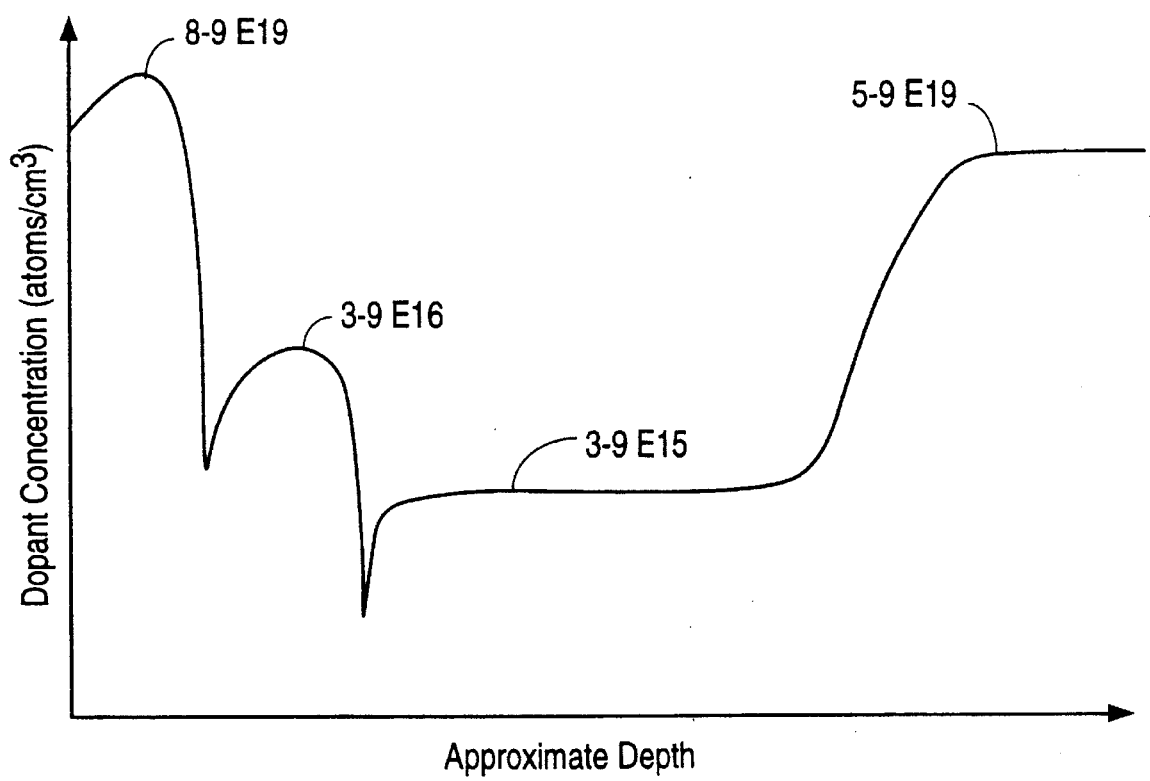
FIG. 7 is an approximate dopant profile taken along line B—B of FIG. 6.

FIG. 7 is a diagram showing an approximate dopant profile along the line labeled B—B in FIG. 6. The 3-9E15 dopant concentration is the dopant concentration of the relatively lightly doped N− type epitaxial region 201A of FIG. 6. Due to the heavily doped N+ type substrate 203 being in close proximity to gate 209A, a relatively high electric field develops between gate 209A and N+ substrate 203 as compared to the electric field developed between gate 209 and N type epitaxial region 202A of FIG. 4. The net P type peak doping concentration in the channel region of P type body region 204 is 3-9E16.

The structure of FIG. 6 has the advantage of not requiring the double epitaxial layer structure in relatively low source-to-drain voltage applications (such as 12–30 volts). The structure of FIG. 4, on the other hand, is usable in relatively high source-to-drain voltage applications (up to approximately 60 volts).

Approximate thickness ranges for the embodiment of FIG. 4 are 0.5 microns for source region 206, 1.0–2.0 microns for P body region 204 at the trench sidewall, 1.0–3.0 microns from the bottom of the P body region at the sidewall to the top of N+ substrate layer 203. The gate oxide may, for example, be 150–1000 angstroms thick. The trench may be, for example, 1.2–2.0 microns deep. Epitaxial layers 201 and 202 may be a combined 4.0–12.0 microns thick. The short channel renders the transistor usable in low threshold voltage applications such as battery applications.

Approximate thickness ranges for the embodiment of FIG. 6 are 0.5 microns for source region 206, 1.0–2.0 microns for P body region 204 at the trench sidewall, 1.0–2.0 microns from the bottom of the P body region at the sidewall to the top of N+ substrate layer 203. The gate oxide may, for example, be 150–1000 angstroms thick. The trench may be approximately 1.2–6.0 microns deep. The bottom of the trench may be approximately 0.5–1.0 microns from the top of N+ type substrate layer 203. Epitaxial layer 201 may be approximately 2.0–5.0 microns thick. The short channel renders the transistor usable in low threshold voltage applications such as battery applications.

Although the invention is described in connection with certain illustrative embodiments for instructional purposes, the invention is not limited thereto. Thicknesses, structural contours, and dopant concentrations may be altered. Other layers and other structures may be added. The invention is applicable to transistors other than double diffused transistors. Both N channel and P channel transistors are realized in accordance with the present invention. Accordingly, modifications, adaptations, and combinations of various aspects of the specific embodiments can be practiced without departing from the scope of the invention as set forth in the following claims.

What is claimed is:

1. A field effect transistor comprising:

a substrate of a first conductivity type being a drain region;

a lower layer of the first conductivity type formed on the substrate and having a doping level less than that of the substrate;

an upper layer of the first conductivity type formed entirely overlying the lower layer and having a doping level less than that of the lower layer;

a trench defined in the upper layer and lower layer and extending to within a predetermined distance of the drain region, the trench being at least partially filled with a conductive gate electrode;

a source region of the first conductivity type formed in the upper layer and extending to a principal-surface of the upper layer and lying adjacent to sidewalls of the trench; and a body region of a second conductivity type extending from the principal surface of the upper layer down to and into at least an upper portion of the lower layer and being spaced apart from a lower portion of the trench, wherein two spaced apart portions of the body region lying respectively on two sides of the trench define a lateral extent of the upper layer, whereby an accumulation region extends from the body region to the lower layer when the transistor is on.

2. The transistor of claim 1, wherein the upper layer has a dopant concentration of N type dopants at least an order of magnitude lower than a dopant concentration of P type dopants in the body region.

3. The transistor of claim 1, wherein the body region has a net peak dopant concentration in the range of $3 \times 10^{16}$ to $9 \times 10^{16}/cm^3$.

4. The transistor of claim 1, wherein the upper and lower layers are each an epitaxial layer.

5. The transistor of claim 1, wherein no portion of the lower layer is laterally adjacent any portion of the upper layer.

6. A field effect transistor comprising:

a substrate of a first conductivity type being a drain region;

a layer of the first conductivity type formed on the substrate and having a doping level less than that of the substrate;

a trench defined in the first layer and in the substrate, the trench being at least partially filled with a conductive gate electrode;

a source region of the first conductivity type formed in the first layer and extending to a principal surface of the first layer and lying adjacent to sidewalls of the trench; and a body region of a second conductivity type extending from the principal surface of the first layer into at least an upper portion of the first layer and being spaced apart from a lower portion of the trench, wherein two portions of the body region lying respectively on two sides of the trench define a lateral extent of the first layer, whereby an accumulation region extends from the substrate to the body region when the transistor is on.

* * * * *

UNITED STATES PATENT AND TRADEMARK OFFICE
CERTIFICATE OF CORRECTION

PATENT NO.   : 5,558,313
DATED        : September 24, 1996
INVENTOR(S)  : Fwu-Iuan Hshieh et al.

It is certified that error appears in the above-identified patent and that said Letters Patent is hereby corrected as shown below:

Column 6, line 12, delete "-".

Column 4, line 6, delete "5,479.037" and substitute --5,479,037--.

Signed and Sealed this

Eighteenth Day of March, 1997

Attest:

BRUCE LEHMAN

*Attesting Officer*       *Commissioner of Patents and Trademarks*